(12) United States Patent
Chen et al.

(10) Patent No.: US 6,995,062 B2
(45) Date of Patent: Feb. 7, 2006

(54) METHOD TO IMPROVE FLASH FORWARD TUNNELING VOLTAGE (FTV) PERFORMANCE

(75) Inventors: Shih-Ming Chen, Hsinchu (TW); Kuo-Chiang Ting, Yunlin (TW); Jen-Shiang Leu, Hsinchu (TW)

(73) Assignee: Taiwan Semiconductor Manufacturing Company, Limited, Hsin-Chu (TW)

( * ) Notice: Subject to any disclaimer, the term of this patent is extended or adjusted under 35 U.S.C. 154(b) by 0 days.

(21) Appl. No.: 10/975,672

(22) Filed: Oct. 28, 2004

(65) Prior Publication Data

US 2005/0056883 A1   Mar. 17, 2005

Related U.S. Application Data

(63) Continuation of application No. 10/290,644, filed on Nov. 8, 2002, now Pat. No. 6,825,085.

(51) Int. Cl.
*H01L 21/336* (2006.01)
(52) U.S. Cl. ...................... 438/257; 257/314
(58) Field of Classification Search ............... 438/257, 438/258, 262–267, 593, 595; 257/314–316, 257/321
See application file for complete search history.

(56) References Cited

U.S. PATENT DOCUMENTS

| | | | |
|---|---|---|---|
| 5,029,130 A | * 7/1991 | Yeh | ............... 365/185.31 |
| 5,879,993 A | 3/1999 | Chien et al. | |
| 6,031,264 A | 2/2000 | Chien et al. | |
| 6,088,269 A | 7/2000 | Lambertson | |
| 6,130,132 A | * 10/2000 | Hsieh et al. | ............... 438/264 |
| 6,355,527 B1 | 3/2002 | Lin et al. | |
| 6,358,796 B1 | 3/2002 | Lin et al. | |
| 6,368,976 B1 | 4/2002 | Yamada | |
| 6,462,370 B2 | 10/2002 | Kuwazawa | |
| 6,528,844 B1 | 3/2003 | Hopper et al. | |
| 6,627,500 B1 | 9/2003 | Liu et al. | |

* cited by examiner

*Primary Examiner*—David Vu
(74) *Attorney, Agent, or Firm*—Duane Morris LLP

(57) ABSTRACT

A floating gate structure and a method for forming a floating gate oxide layer comprising the following steps. A structure having a first dielectric layer formed thereover is provided. An oxide layer is formed over the first dielectric layer. A nitride layer is formed over the oxide layer. The nitride layer is patterned to form an opening exposing a portion of the oxide layer. A portion of the first dielectric layer is exposed by removing: the exposed portion of the oxide layer; and portions of the oxide layer underneath the patterned nitride layer adjacent to the opening to form respective undercuts. The exposed portion of the first dielectric layer is oxidized to form the floating gate oxide layer.

20 Claims, 2 Drawing Sheets

METHOD TO IMPROVE FLASH FORWARD TUNNELING VOLTAGE (FTV) PERFORMANCE

CROSS-REFERENCE TO RELATED APPLICATION

This application is a continuation of U.S. patent application Ser. No. 10/290,644 to Shih-Ming Chen, Kuo-Chiang Ting and Jen-Shiang Leu, entitled "Method to Improve Flash Forward Tunneling Voltage (FTV) Performance", filed Nov. 8, 2002, now U.S. Pat. No. 6,825,085 the entirety of which is hereby incorporated by reference herein.

FIELD OF THE INVENTION

The present invention relates generally to semiconductor fabrication and more specifically to formation of flash memory floating gate oxide.

BACKGROUND OF THE INVENTION

The most important electrical parameter of Flash memory is Forward Tunneling Voltage (FTV). FTV is a measurement of the ease of erasing the cell by removing the charge from F6->CG. The trap-up rate, i.e. electron ($e^-$) trapping in oxide, is also an important electrical parameter.

U.S. Pat. No. 6,031,264 B1 to Chien et al. describes a flash EEPROM process using polyoxide steps.

U.S. Pat. No. 5,879,993 to Chien et al. describes a flash EEPROM process.

U.S. Pat. No. 6,355,527 B1 to Lin et al. describes a flash EEPROM process.

U.S. Pat. No. 6,088,269 to Lambertson and U.S. Pat. No. 6,358,796 B1 to Lin et al. each describe related Flash processes.

SUMMARY OF THE INVENTION

Accordingly, it is an object of one or more embodiments of the present invention to provide a method of forming tip-corner-shaped floating gate oxide.

Other objects will appear hereinafter.

It has now been discovered that the above and other objects of the present invention may be accomplished in the following manner. Specifically, a structure having a first dielectric layer formed thereover is provided. An oxide layer is formed over the first dielectric layer. A nitride layer is formed over the oxide layer. The nitride layer is patterned to form an opening exposing a portion of the oxide layer. A portion of the first dielectric layer is exposed by removing: the exposed portion of the oxide layer; and portions of the oxide layer underneath the patterned nitride layer adjacent to the opening to form respective undercuts. The exposed portion of the first dielectric layer is oxidized to form the floating gate oxide layer. A floating gate oxide structure, comprising: (1) a structure having a dielectric layer thereover; (2) a patterned nitride layer over the dielectric layer; the patterned nitride layer including an opening therein proximate undercuts between the patterned nitride layer and the dielectric layer; (3) a floating gate oxide layer between the dielectric layer and the patterned nitride layer; the floating gate oxide layer including: opposing tip corners within the undercuts; and a central, bulge portion at least partially exposed by the patterned nitride layer opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Known to the Inventors—Not to be Considered Prior Art

The following is known to the inventors and is not to be considered as prior art for the purposes of this invention.

The shape of the floating gate oxide is a key factor in the Forward Tunneling Voltage (FTV) and the trap-up rate of Flash memory. The inventors have discovered that achieving a tip-shape of the floating gate oxide improves the FTV of the Flash memory.

Figure 1:
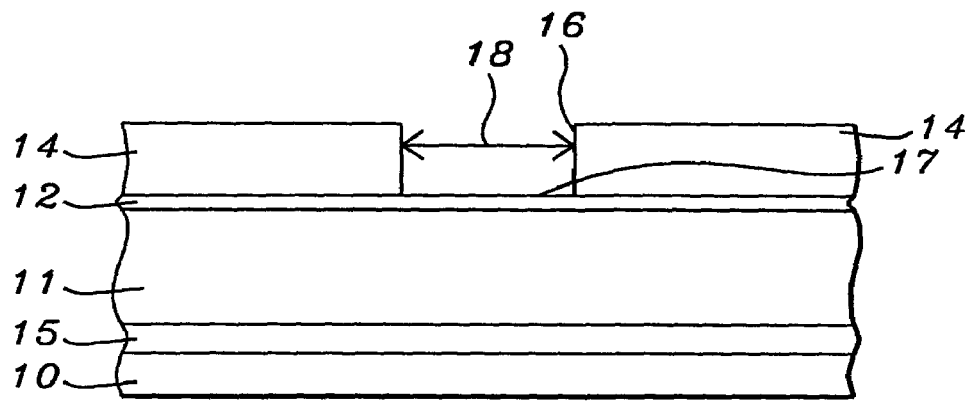
FIGS. 1 to 3 schematically illustrate a preferred embodiment of the present invention.

Initial Structure—FIG. 1

As shown in FIG. 1, a structure 10 is provided having an upper gate oxide layer 15 is formed thereover.

A polysilicon layer 11 formed over gate oxide layer 15 to a thickness of preferably from about 900 to 1100 Å, more preferably from about 950 to 1050 Å and most preferably about 1000 Å.

Structure 10 is preferably a silicon substrate or a germanium substrate, is more preferably a silicon substrate and is understood to possibly include a semiconductor wafer or substrate.

A thin silicon oxide layer 12 is then formed over polysilicon layer 11 to a thickness of preferably from about 26 to 34 Å, more preferably from about 28 to 32 Å and most preferably about 30 Å.

A nitride or silicon nitride ($Si_3N_4$ or just SiN) layer 14 is formed over the thin oxide layer 12 to a thickness of preferably from about 720 to 880 Å, more preferably from about 760 to 840 Å and most preferably about 800 Å.

SiN layer 14 is then patterned preferably using a dry etch process at the following parameters:

temperature: preferably from about 15 to 25° C. and more preferably from about 17 to 23° C.;

pressure: preferably from about 225 to 275 mTorr and more preferably from about 245 to 255 mTorr;

RF power: preferably from about 1000 to 1400 W and more preferably from about 1080 to 1320 W;

$O_2$ gas flow: preferably from about 4 to 6 sccm and more preferably from about 4.5 to 5.5 sccm;

$CF_4$ gas flow: preferably from about 66 to 76 sccm and more preferably from about 68 to 74 sccm;

Ar gas flow: preferably from about 750 to 950 sccm and more preferably from about 800 to 900 sccm; and time: preferably from about 45 to 55 seconds and more preferably from about 48 to 52 seconds.

Patterned SiN layer 14 includes an opening 16 exposing a portion 17 of thin oxide layer 12. Opening 16 has a width 18 of preferably from about 0.34 to 0.40 µm and more preferably from about 0.36 to 0.38 µm.

Figure 2:
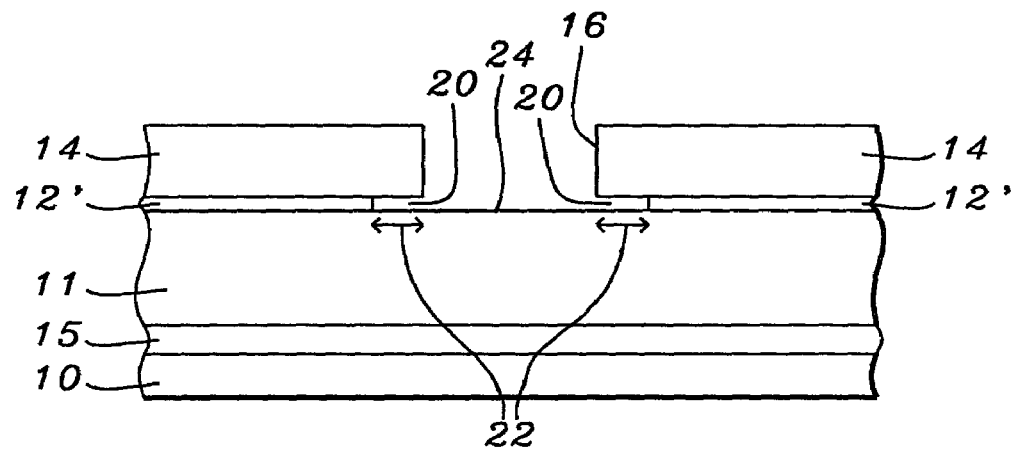

Formation of Undercut 20 in Thin Oxide Layer 12 Under Patterned SiN Layer 14—FIG. 2

As shown in FIG. 2, thin oxide layer 12 is etched to remove the exposed portion 17 of thin oxide layer 12 and to remove a portion of the thin oxide layer 12 adjacent opening 16 under patterned SiN layer 14, forming undercuts 20 and exposing a portion 24 of underlying polysilicon layer 11. Undercuts 20 extend preferably from about 30 to 70 Å under patterned SiN layer 14, more preferably from about 40 to 60 Å and most preferably about 50 Å.

Thin oxide layer 12 is preferably etched to form undercuts 20 using an oxide wet bench dip.

The oxide wet bench is conducted at the following parameters:
HF: $H_2O$ ratio: preferably from about 90:1 to 110:1, more preferably from about 95:1 to 105:1 and most preferably about 100:1;
temperature: preferably from about 18.5 to 28.5° C. and more preferably from about 20.5 to 26.5° C.;
pressure: preferably from about 740 to 780 mTorr and more preferably from about 750 to 770 mTorr; and
time: preferably from about 80 to 100 seconds and more preferably from about 85 to 95 seconds.

Figure 3:
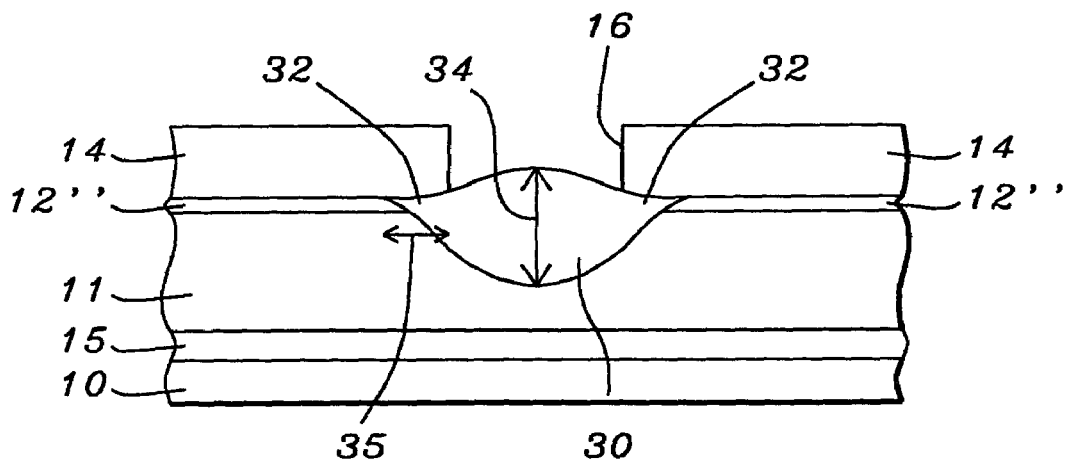

Oxidation of The Exposed Portion 24 of Polysilicon Layer 11—FIG. 3

As shown in FIG. 3, the exposed portion 24 of polysilicon layer 11 is oxidized to form floating gate oxide portion 30 having respective tip corners 32 that have a longer and sharper tip profile induced by undercuts 20 than found in conventional methods not having such undercuts 20 formed before the oxidation of polysilicon layer 11. Floating gate oxide portion 30 is essentially indistinguishable from the adjacent etched thin oxide layer 12" as shown in FIG. 3.

Floating gate oxide portion 30 has a mid-thickness 34 of preferably from about 3500 to 4500 Å and more preferably from about 3800 to 4200 Å. Tip corners 32 each have an average width 35 of preferably from about 250 to 350 Å and more preferably from about 280 to 320 Å.

Figure 4:
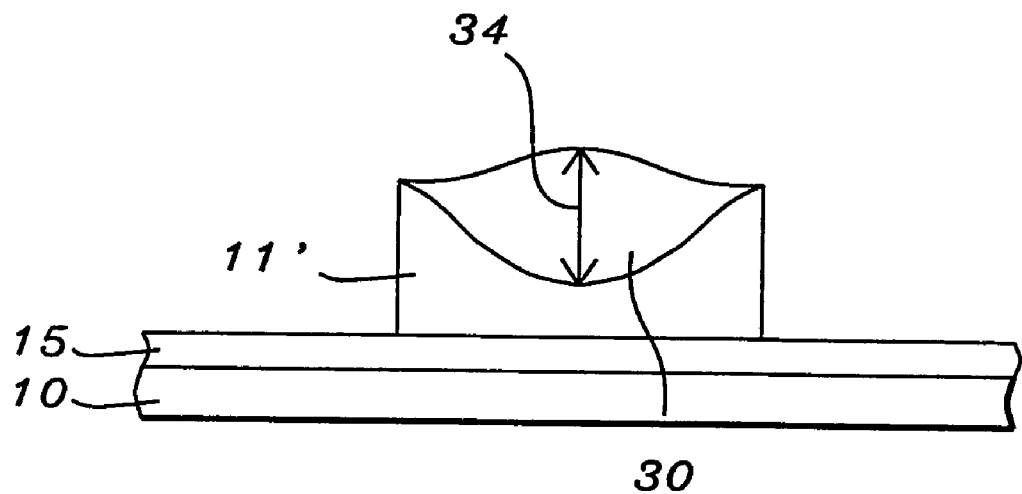
FIGS. 4 and 5 schematically illustrate further processing of the structure of FIG. 3 in forming a flash memory.
Figure 5:
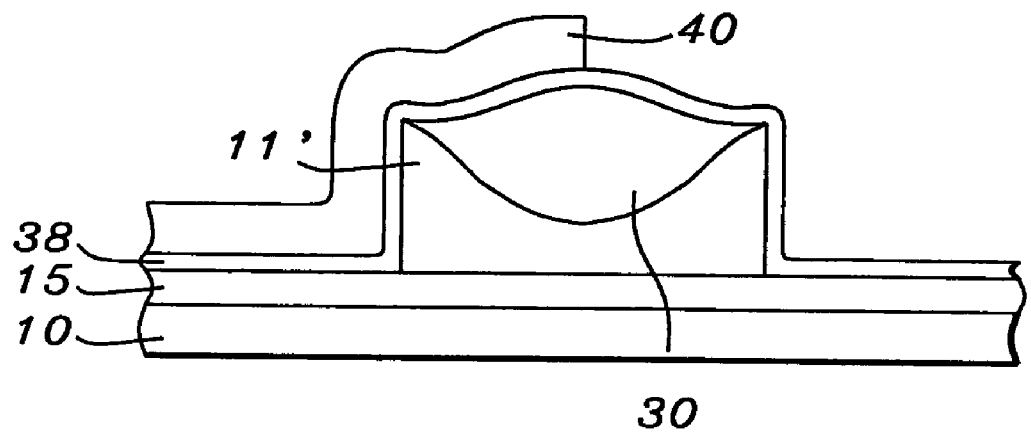

Further processing may then proceed in forming a flash memory 50 such as shown in FIG. 5 through FIG. 4 with, for example: the removal of nitride layer 14 and the remainder of etched thin oxide layer 12"; the patterning and removal of polysilicon layer 11 not under floating gate oxide portion 30 to form remaining polysilicon layer 11'; the formation of an interpoly oxide layer 38 over the structure and formation of control gate 40.

The inventors have determined that the flash forward tunneling voltage (FTV) performance of flash memory is improved from about 7.0 to 8.0 and more preferably from about 7.4 to 7.6 when the method of the present invention is used to form the floating gate oxide layer 30 employed in the flash memory. Similarly, the FTV is decreased preferably from about 6.0 to 7.0 and more preferably from about 6.4 to 6.6 in such a flash memory.

While particular embodiments of the present invention have been illustrated and described, it is not intended to limit the invention, except as defined by the following claims.

We claim:

1. A method of forming a floating gate oxide layer of a FLASH memory device comprising the steps of:
providing a structure having a conductor layer formed thereover;
forming a first layer over the conductor layer;
forming a second layer over the first layer;
patterning the second layer to form an opening exposing a portion of the first layer;
exposing a portion of the conductor layer by removing:
the exposed portion of the first layer; and
portions of the first layer underneath the patterned second layer adjacent to the opening to form respective undercuts; and
oxidizing the exposed portion of the conductor layer to form the floating gate oxide layer.

2. The method of claim 1, wherein the floating gate oxide layer includes respective tip corners.

3. The method of claim 2, further comprising the step of forming a FLASH memory device incorporating the floating gate oxide layer, whereby the forward tunneling voltage of the FLASH memory is improved.

4. The method of claim 2, wherein the floating gate oxide layer has a mid-thickness of from about 3500–4500 Å and wherein each of the tip corners has an average width of from about 250–350 Å.

5. The method of claim 1, wherein said conductor layer comprises polysilicon.

6. The method of claim 1, wherein said first layer comprises an oxide and said second layer comprises a nitride.

7. The method of claim 1, wherein said first layer has a thickness of from about 26–34 Å; the conductor layer has a thickness of from about 900–1100 Å; and the second layer has a thickness of from about 720–880 Å.

8. The method of claim 1, wherein said second layer is patterned using a dry etch.

9. The method of claim 1, wherein the first layer comprises an oxide, and the exposed portion of the first layer and the portions of the first layer underneath the patterned second layer adjacent to the opening are removed by an oxide wet bench dip etching process.

10. The method of claim 9, wherein said oxide wet bench dip process comprises the following conditions:
$HF:H_2O$ ratio, from about 90:1 to 110:1;
temperature, from about 18.5 to 28.5° C.;
pressure, from about 740 to 780 mTorr; and
time, from about 85–95 seconds.

11. The method of claim 1, wherein the opening within the patterned second layer has a width of from about 0.34–0.40 µm.

12. The method of claim 1, wherein the undercuts extend from about 30–70 Å underneath the patterned second layer.

13. The method of claim 1, further comprising the step of forming a FLASH memory device incorporating the floating gate oxide layer.

14. A method of forming a FLASH memory device, comprising the steps of:
providing a substrate having a lower gate oxide layer formed thereover;
forming a conductor layer comprising polysilicon over said lower gate oxide layer;
forming a first layer over the conductor layer;
forming a second layer over the first layer;
patterning the second layer to form an openings exposing a portion of the first layer;
exposing a portion of the conductor layer by removing:
the exposed portion of the first layer; and
portions of the first layer underneath the patterned second layer adjacent to the opening to form respective undercuts;
oxidizing the exposed portion of the conductor layer to form a floating gate oxide layer including respective tip corners, whereby the forward tunneling voltage of the FLASH memory is improved;
removing remaining portions of said first and second layers; and
completing said FLASH memory device.

15. The method of claim 14, wherein said first layer comprises an oxide, and the exposed portion of said first layer and the portions of the first layer underneath the patterned second layer adjacent to the opening are removed by an oxide wet bench dip etching process.

16. The method of claim 15, wherein said second layer is patterned using a dry etch and said undercuts extend from about 30–70 Å.

17. The method of claim 16, wherein said second layer comprises a nitride layer and said dry etch process utilizes the following conditions:
temperature, from about 15 to 25° C.;
pressure, from about 225 to 275 mTorr;
RF power, from about 1000 to 1400 W;
$O_2$ gas flow, from about 4 to 6 sccm;
$CF_4$ gas flow, from about 66 to 76 sccm;
Ar gas flow, from about 750 to 950 sccm; and
time, from about 45 to 55 seconds.

18. The method of claim 17, wherein the floating gate oxide layer has a mid thickness of from about 3500–4500 Å and wherein each of the tip corners has an average width of from about 250–350 Å.

19. The method of claim 18, wherein said oxide wet bench dip process comprises the following conditions:
$HF:H_2O$ ratio, from about 90:1 to 110:1;
temperature, from about 18.5 to 28.5° C.;
pressure, from about 740 to 780 mTorr; and
time, from about 85–95 seconds.

20. The method of claim 14, wherein the completing step comprises the following steps:
removing portions of the conductor layer not under the floating gate oxide layer; and
forming a control gate over said floating gate oxide layer.

* * * * *